United States Patent
Ma

(10) Patent No.: US 9,881,543 B2
(45) Date of Patent: Jan. 30, 2018

(54) SHIFT REGISTER UNIT, METHOD FOR DRIVING THE SAME, SHIFT REGISTER, AND DISPLAY DEVICE

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/306,598

(22) PCT Filed: Nov. 2, 2015

(86) PCT No.: PCT/CN2015/093561
§ 371 (c)(1),
(2) Date: Oct. 25, 2016

(87) PCT Pub. No.: WO2016/201862
PCT Pub. Date: Dec. 22, 2016

(65) Prior Publication Data
US 2017/0186360 A1    Jun. 29, 2017

(30) Foreign Application Priority Data
Jun. 19, 2015    (CN) .......................... 2015 1 0346044

(51) Int. Cl.
*G11C 19/28*    (2006.01)
*G11C 19/00*    (2006.01)
(Continued)

(52) U.S. Cl.
CPC ......... *G09G 3/2092* (2013.01); *G11C 19/184* (2013.01); *G11C 19/28* (2013.01);
(Continued)

(58) Field of Classification Search
CPC ......... G09G 3/2092; G09G 2310/0286; G11C 19/184; G11C 19/28; H01L 27/3244
See application file for complete search history.

(56) References Cited

U.S. PATENT DOCUMENTS 9,620,241 B2 *   4/2017   Han .................. G11C 19/28
2002/0044625 A1  4/2002   Kim et al.
(Continued)

FOREIGN PATENT DOCUMENTS

CN       1758321 A       4/2006
CN       101221818 A     7/2008
(Continued)

OTHER PUBLICATIONS

International Search Report and Written Opinion for Application No. PCT/CN2015/093561, dated Nov. 2, 2015, 13 Pages.

*Primary Examiner* — Xuemei Zheng
(74) *Attorney, Agent, or Firm* — Brooks Kushman P.C.

(57) ABSTRACT

A shift register unit includes a first shift register module and a second shift register module. The first shift register module includes a first input module configured to input a start signal to a first control node, a second input module configured to input a first level to a second control node, a first output control module configured to input a second level to the first control node, a second output control module configured to input a first clock signal to the second control node, a first output module configured to input the first clock signal to a first output end, and a second output module configured to input the first level to the first output end. The second shift register module includes a second output end, third and fourth input modules, third and fourth output control modules, and third and fourth output modules.

17 Claims, 3 Drawing Sheets

(51) Int. Cl.
*G09G 3/20* (2006.01)
*G11C 19/18* (2006.01)
*H01L 27/32* (2006.01)

(52) U.S. Cl.
CPC . *H01L 27/3244* (2013.01); *G09G 2300/0809* (2013.01); *G09G 2310/0286* (2013.01)

(56) References Cited

U.S. PATENT DOCUMENTS

| | | | |
|---|---|---|---|
| 2010/0201668 A1 | 8/2010 | Ko et al. | |
| 2014/0079173 A1* | 3/2014 | Yan | G11C 19/28 377/64 |
| 2014/0118052 A1* | 5/2014 | Liu | G11C 19/28 327/394 |
| 2016/0064098 A1* | 3/2016 | Han | G11C 19/28 345/211 |
| 2016/0293090 A1* | 10/2016 | Long | G09G 3/2092 |

FOREIGN PATENT DOCUMENTS

| | | |
|---|---|---|
| CN | 101939791 A | 1/2011 |
| CN | 102486909 A | 6/2012 |
| CN | 102651239 A | 8/2012 |
| CN | 102708926 A | 10/2012 |
| CN | 103700357 A | 4/2014 |
| CN | 104299595 A | 1/2015 |
| CN | 104318888 A | 1/2015 |
| CN | 104318904 A | 1/2015 |
| CN | 104900189 A | 9/2015 |
| JP | 2014074922 A | 4/2014 |

* cited by examiner

SHIFT REGISTER UNIT, METHOD FOR DRIVING THE SAME, SHIFT REGISTER, AND DISPLAY DEVICE

CROSS-REFERENCE TO RELATED APPLICATIONS

This application is the U.S. national phase of PCT Application No. PCT/CN2015/093561 filed on Nov. 2, 2015, which claims priority to Chinese Patent Application No. 201510346044.4 filed on Jun. 19, 2015, the disclosures of which are incorporated in their entirety by reference herein.

TECHNICAL FIELD

The present disclosure relates to the field of display technology, in particular to a shift register unit, its driving method, a shift register and a display device.

BACKGROUND

Due to a special sequence requirement of an organic light-emitting diode (OLED) display device, it is necessary to provide a normally-open shift register (a light-emitting control shift register) at a light-emitting stage, so as to control a pixel to be always in a light-emitting state. However, the current light-emitting control shift register is of a complex structure, and a plurality of transistors is required, so it is very hard to provide a narrow-bezel display device.

SUMMARY

A main object of the present disclosure is to provide a shift register unit, its driving method, a shift register and a display device, so as to reduce the number of transistors, thereby to provide a narrow-bezel display device.

In one aspect, the present disclosure provides in some embodiments a shift register unit, including a first shift register module and a second shift register module. The first shift register module includes: a start signal input end; a first output end; a first input module connected to the start signal input end and configured to input a start signal to a first control node under the control of a first clock signal; a second input module configured to input a first level to a second control node under the control of the first clock signal; a first output control module configured to input a second level to the first control node under the control of a second clock signal and the second control node; a second output control module configured to input the first clock signal to the second control node under the control of the first control node; a first output module configured to input the first clock signal to the first output end under the control of the first control node; and a second output module configured to input the first level to the first output end under the control of the second control node. The second shift register module includes: a second output end; a third input module connected to the first control node and configured to input a signal from the first control node to a third control node under the control of the second clock signal; a fourth input module configured to input the first level to a fourth control node under the control of the second clock signal; a third output control module configured to input the second level to the third control node under the control of the first clock signal and the fourth control node; a fourth output control module configured to input the second clock signal to the fourth control node under the control of the third control node; a third output module configured to input the second clock signal to the second output end under the control of the third control node; and a fourth output module configured to input the first level to the second output end under the control of the fourth control node. The first clock signal is of a phase reverse to the second clock signal.

During the implementation, the first input module is connected to the first control node, and configured to receive the first clock signal and the start signal, and under the control of the first clock signal, input the start signal to the first control node at a first initial stage and a first maintenance stage, and maintain a potential at the first control node to be invalid at the first maintenance stage. The second input module is connected to the second control node, configured to receive the first clock signal and the first level, and specially configured to input the first level to the second control node at the first initial stage and the first maintenance stage. The first output control module is connected to the first control node and the second control node, and configured to receive the second level and the second clock signal, and input the second level to the first control node at the first maintenance stage under the control of the second clock signal and the second control node. The second output control module is connected to the first control node and the second control node, and configured to receive the first clock signal, and input the first clock signal to the second control node at a first output stage under the control of the first control node. The first output module is connected to the first control node and the first output end, and configured to receive the first clock signal, and input the first clock signal to the first output end under the control of the first control node. The second output module is connected to the second control node and the first output end, and configured to receive the first level, and input the first level to the first output end under the control of the second control node.

During the implementation, the third input module is connected to the first control node and the third control node, and configured to receive the second clock signal, pull down the potential at the first control node under the control of the second clock signal at the first output stage, and under the control of the second clock signal, input the signal from the first control node to the third control node at a second initial stage, and maintain a potential at the third control node to be invalid at a second maintenance stage. The fourth input module is connected to the fourth control node, and configured to receive the second clock signal and the first level, and input the first level to the fourth control node at the second initial stage and the second maintenance stage. The third output control module is connected to the third control node and the fourth control node, and configured to receive the second level and the first clock signal, and under the control of the first clock signal and the fourth control node, input the second level to the third control node at the second maintenance stage. The fourth output control module is connected to the third control node and the fourth control node, and configured to receive the second clock signal, and input the second clock signal to the fourth control node at a second output stage under the control of the third control node. The third output module is connected to the third control node and the second output end, and configured to receive the second clock signal, and under the control of the third control node, input the second clock signal to the second output end. The fourth output module is connected to the fourth control node and the second output end, and configured to receive the first level, and under the control of the fourth control node, and output the first level at the second output end. The first output stage is the second initial stage, the second output stage is half a clock cycle later than the first output stage, and the second maintenance stage is half a clock cycle later than the first maintenance stage.

During the implementation, the first input module includes: a first input transistor, a gate electrode of which is configured to receive the first clock signal, a first electrode of which is configured to receive the start signal, and a second electrode of which is connected to the first control node; and a first capacitor, a first end of which is connected to the first electrode of the first input transistor, and a second end of which is configured to receive the first clock signal.

During the implementation, the second input module includes a second input transistor, a gate electrode of which is configured to receive the first clock signal, a first electrode of which is configured to receive the first level, and a second electrode of which is connected to the second control node.

During the implementation, the first output control module includes: a first control transistor, a gate electrode of which is connected to the second control node, and a first electrode of which is configured to receive the second level; and a second control transistor, a gate electrode of which is configured to receive the second clock signal, a first electrode of which is connected to a second electrode of the first control transistor, and a second electrode of which is connected to the first control node.

During the implementation, the second output control module includes a third control transistor, a gate electrode of which is connected to the first control node, a first electrode of which is connected to the second control node, and a second electrode of which is configured to receive the first clock signal.

During the implementation, the first output module includes a first output transistor, a gate electrode of which is connected to the first control node, a first electrode of which is connected to the first output end, and a second electrode of which is configured to receive the first clock signal.

During the implementation, the second output module includes: a second output transistor, a gate electrode of which is connected to the second control node, a first electrode of which is configured to receive the first level, and a second electrode of which is connected to the first output end; and a second capacitor, a first end of which is configured to receive the first level, and a second end of which is connected to the second control node.

During the implementation, the third input module includes: a third input transistor, a gate electrode of which is configured to receive the second clock signal, a first electrode of which is connected to the first control node, and a second electrode of which is connected to the third control node; and a third capacitor, a first end of which is configured to receive the second clock signal, and a second end of which is connected to the first control node.

During the implementation, the fourth input module includes a fourth input transistor, a gate electrode of which is configured to receive the second clock signal, a first electrode of which is configured to receive the first level, and a second electrode of which is connected to the fourth control node.

During the implementation, the third output control module includes: a fourth control transistor, a gate electrode of which is connected to the fourth control node, and a first electrode of which is configured to receive the second level; and a fifth control transistor, a gate electrode of which is configured to receive the second clock signal, a first electrode of which is connected to a second electrode of the fourth control transistor, and a second electrode of which is connected to the third control node.

During the implementation, the fourth output control module includes a sixth control transistor, a gate electrode of which is connected to the third control node, a first electrode of which is connected to the fourth control node, and a second electrode of which is configured to receive the second clock signal.

During the implementation, the third output module includes a third output transistor, a gate electrode of which is connected to the third control node, a first electrode of which is connected to the second output end, and a second electrode of which is configured to receive the second clock signal.

During the implementation, the fourth output module includes: a fourth output transistor, a gate electrode of which is connected to the fourth control node, a first electrode of which is configured to receive the first level, and a second electrode of which is connected to the second output end; and a fourth capacitor, a first end of which is configured to receive the first level, and a second end of which is connected to the fourth control node.

In another aspect, the present disclosure provides in some embodiments a method for driving a shift register unit, including steps of: inputting, by a first input module, a start signal to a first control node under the control of a first clock signal; inputting, by a second input module, a first level to a second control node under the control of the first clock signal; inputting, by a first output control module, a second level to the first control node under the control of a second clock signal and the second control node; inputting, by a second output control module, the first clock signal to the second control node under the control of the first control node; inputting, by a first output module, the first clock signal to a first input end under the control of the first control node; inputting, by a second output module, the first level to the first output end under the control of the second control node; inputting, by a third input module, a signal from the first control node to a third control node under the control of the second clock signal; inputting, by the fourth input module, the first level to a fourth control node under the control of the second clock signal; inputting, by a third output control module, a second level to the third control node under the control of the first clock signal and the fourth control node; inputting, by a fourth output control module, the second clock signal to the fourth control node under the control of the third control node; inputting, by a third output module, the second clock signal to a second output end under the control of the third control node; and inputting, by a fourth output module, the first level to the second output end under the control of the fourth control node.

In yet another aspect, the present disclosure provides in some embodiments a shift register including multiple levels of the above-mentioned shift register units. Apart from a first-level shift register unit, a start signal input end of a current-level shift register unit is connected to a third control node of a previous-level shift register unit.

In still yet another aspect, the present disclosure provides in some embodiments a display device including the above-mentioned shift register.

According to the shift register unit, its driving method, the shift register and the display device in the embodiments of the present disclosure, the start signal is inputted to a next-level shift register unit under the control of the third control node of the current-level shift register unit, so as to prevent a signal transmission effect between the shift register units from being adversely affected by a display region, thereby to improve an output effect and improve the product yield. In addition, it is able to reduce the number of the transistors in the shift register unit, thereby to provide a narrow-bezel display device.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
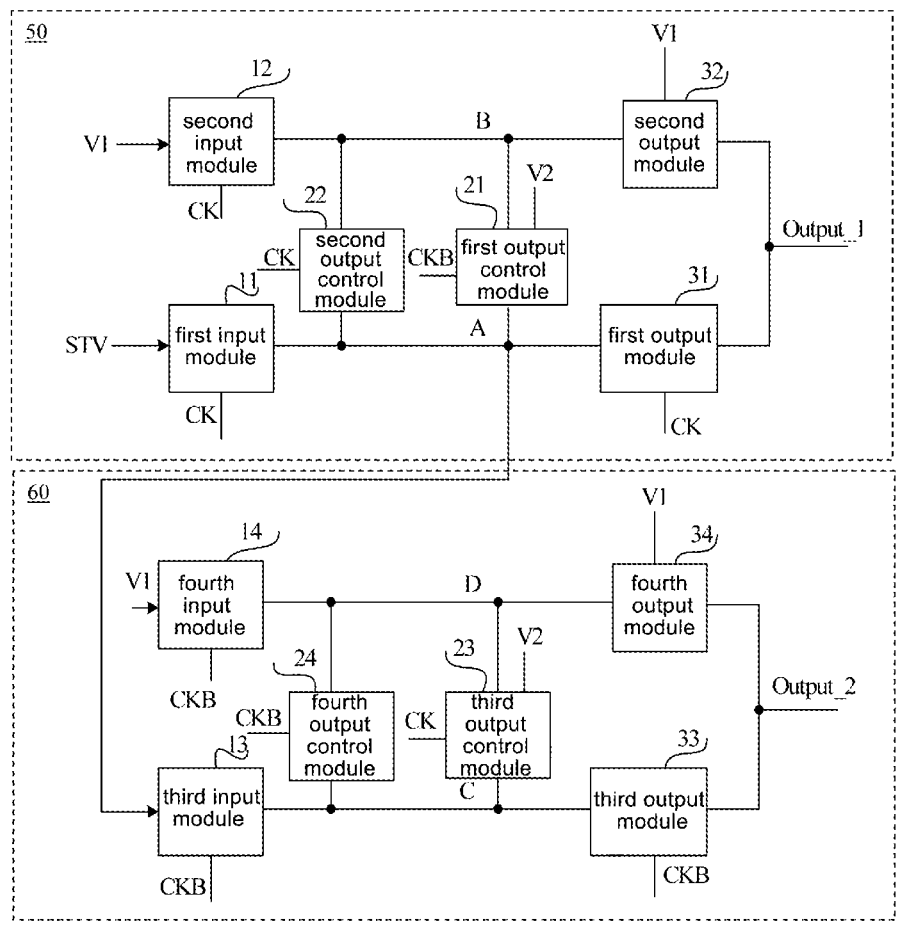
FIG. 1 is a schematic view showing a shift register unit according to one embodiment of the present disclosure.

As shown in FIG. 1, the present disclosure provides in some embodiments a shift register unit, which includes a shift register module 50 and a second shift register module 60. The first shift register module 50 includes: a start signal input end configured to input a start signal STV; a first output end Output_1; a first input module 11 connected to the start signal input end and configured to input the start signal STV to a first control node A under the control of a first clock signal CK; a second input module 12 configured to input a first level V1 to a second control node B under the control of the first clock signal CK; a first output control module 21 configured to input a second level V2 to the first control node A under the control of a second clock signal CKB and the second control node B; a second output control module 22 configured to input the first clock signal CK to the second control node B under the control of the first control node A; a first output module 31 configured to input the first clock signal CK to the first output end Output_1 under the control of the first control node A; and a second output module 32 configured to input the first level V1 to the first output end Output_1 under the control of the second control node B.

The second shift register module 60 includes: a second output end Output_2; a third input module 13 connected to the first control node A and configured to input a signal from the first control node A to a third control node C under the control of the second clock signal CKB; a fourth input module 14 configured to input the first level V1 to a fourth control node D under the control of the second clock signal; a third output control module 23 configured to input the second level V2 to the third control node C under the control of the first clock signal CK and the fourth control node D; a fourth output control module 24 configured to input the second clock signal CKB to the fourth control node D under the control of the third control node C; a third output module 33 configured to input the second clock signal CKB to the second output end Output_2 under the control of the third control node C; and a fourth output module 34 configured to input the first level V1 to the second output end Output_2 under the control of the fourth control node D. The first clock signal CK is of a phase reverse to the second clock signal CKB.

According to the shift register unit in the embodiments of the present disclosure, the start signal is inputted to a next-level shift register unit under the control of the first control node of a current-level shift register unit, so as to prevent a signal transmission effect between the shift register units from being adversely affected by a display region, thereby to improve an output effect and improve the product yield.

To be specific, the first input module is connected to the first control node, and configured to receive the first clock signal and the start signal, and under the control of the first clock signal, input the start signal to the first control node at a first initial stage, and maintain a potential at the first control node to be invalid at a first maintenance stage.

The second input module is connected to the second control node, configured to receive the first clock signal and the first level, and specially configured to input the first level to the second control node at the first initial stage and the first maintenance stage.

The first output control module is connected to the first control node and the second control node, and configured to receive the second level and the second clock signal, and input the second level to the first control node at the first maintenance stage under the control of the second clock signal and the second control node.

The second output control module is connected to the first control node and the second control node, and configured to receive the first clock signal, and input the first clock signal to the second control node at a first output stage under the control of the first control node.

The first output module is connected to the first control node and the first output end, and configured to receive the first clock signal, and input the first clock signal to the first output end under the control of the first control node.

The second output module is connected to the second control node and the first output end, and configured to receive the first level, and input the first level to the first output end under the control of the second control node.

To be specific, the third input module is connected to the first control node and the third control node, and configured to receive the second clock signal, pull down the potential at the first control node under the control of the second clock signal at the first output stage, and under the control of the second clock signal, input the signal from the first control node to the third control node at a second initial stage, and maintain a potential at the third control node to be invalid at a second maintenance stage.

The fourth input module is connected to the fourth control node, and configured to receive the second clock signal and the first level, and input the first level to the fourth control node at the second initial stage and the second maintenance stage.

The third output control module is connected to the third control node and the fourth control node, and configured to receive the second level and the first clock signal, and under the control of the first clock signal and the fourth control node, input the second level to the third control node at the second maintenance stage.

The fourth output control module is connected to the third control node and the fourth control node, and configured to receive the second clock signal, and input the second clock signal to the fourth control node at a second output stage under the control of the third control node.

The third output module is connected to the third control node and the second output end, and configured to receive the second clock signal, and under the control of the third control node, input the second clock signal to the second output end.

The fourth output module is connected to the fourth control node and the second output end, and configured to receive the first level, and under the control of the fourth control node, and input the second level to the second output end. The first output stage is the second initial stage, the second output stage is half a clock cycle later than the first output stage, and the second maintenance stage is half a clock cycle later than the first maintenance stage.

During the operation, in the case that the shift register unit includes p-type transistors, the first level V1 may be a low level VGL, and the second level V2 may be a high level VGH.

Figure 2:
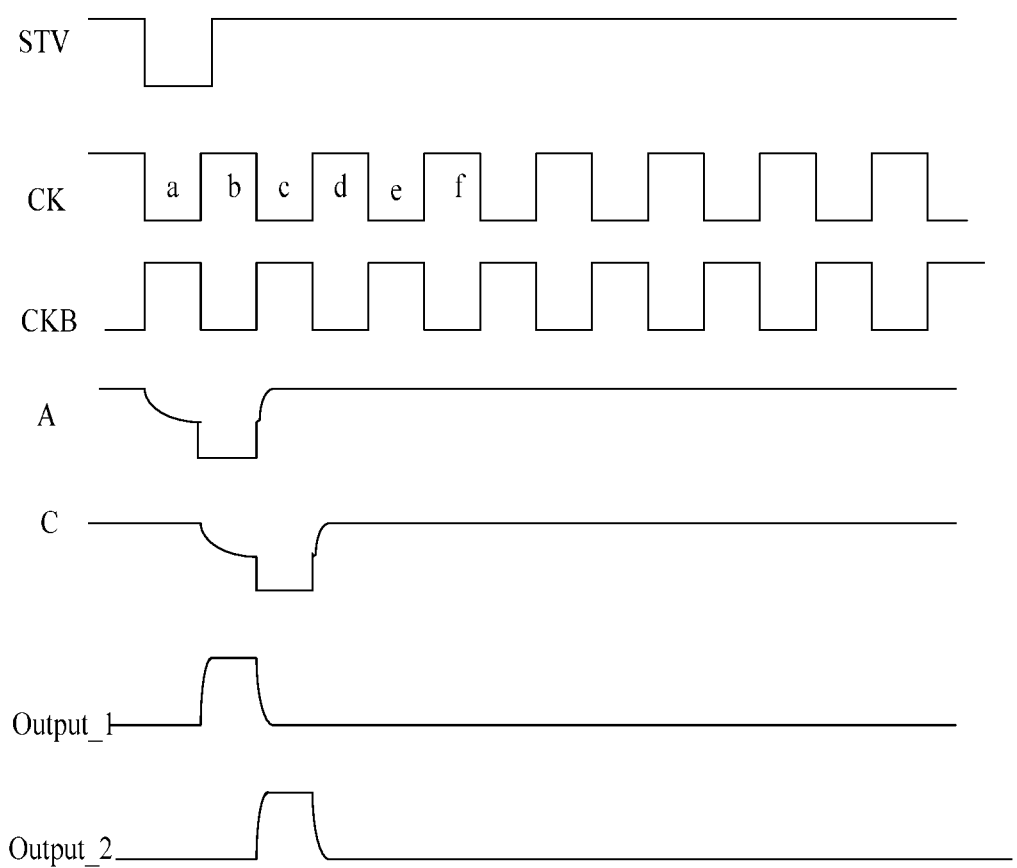
FIG. 2 is a sequence diagram of a shift register according to one embodiment of the present disclosure.

To be specific, as shown in FIG. 2, in the case that the first level V1 is a low level VGL and the second level V2 is a high level VGH, the first input module 11 is connected to the first control node A, and configured to receive the first clock signal CK and the start signal STV, and under the control of the first clock signal CK, input the start signal to the first control node at a first initial stage a (the start signal is a low level at the first initial stage a), and maintain the potential at the first control node A to be at a high level at the first maintenance stage (the first maintenance stage includes stag c, stage d, stage e, stage f and a time period after stage f and before the beginning of a next frame).

The second input module 12 is connected to the second control node B, and configured to receive the first clock signal CK and the low level VGL, and input the low level VGL to the second node B at the first initial stage a and the first maintenance stage.

The first output control module 21 is connected to the first control node A and the second control node B, and configured to receive the high level VGH and the second clock signal CKB, and under the control of the second clock signal CKB and the second control node B, input the high level VGH to the first control node A at the stage d of the first maintenance stage.

The second output control module 22 is connected to the first control node A and the second control node B, and configured to receive the first clock signal CK, and under the control of the first control node A, input the first clock signal CK to the second control node B at a first output stage b.

The first output module 31 is connected to the first control node A and the first output end Output_1, and configured to receive the first clock signal CK, and under the control of the first control node A, input the first clock signal CK to the first output end Output_1.

The second output module 32 is connected to the second control node B and the first output end Output_1, and configured to receive the low level VGL, and under the control of the second control node B, input the low level VGL to the first output end Output_1.

The third input module 13 is connected to the first control node A and the third control node C, and configured to receive the second clock signal CKB, and under the control of the second clock signal CKB, input the second clock signal CKB to the first control node A at the first output stage b, input the signal from the first control node A to the third control node C at a second initial stage, and maintain a potential at the third control node C to be at a high level at the second maintenance stage. The second initial stage is just the first output stage b. It shall be appreciated that, the second initial stage is half of a clock cycle later than the first output stage a, and the second maintenance stage is half a clock cycle later than the first maintenance stage.

The fourth input module 14 is connected to the fourth control node D, and configured to receive the second clock signal CKB and the low level VGL, and input the low level VGL to the fourth control node D at the second initial stage and the second maintenance stage.

The third output control module 23 is connected to the third control node C and the fourth control node D, and configured to receive the high level VGH and the first clock signal CK, and under the control of the first clock signal CK and the fourth control node D, input the high level VGH to the third control node C at the stage e of the second maintenance stage.

The fourth output control module 24 is connected to the third control node C and the fourth control node D, and configured to receive the second clock signal CKB, and under the control of the third control node C, input the second clock signal CKB to the fourth control node D. The second output stage is half a clock cycle later than the first output stage b.

The third output module 33 is connected to the third control node C and the second output end Output_2, and configured to receive the second clock signal CKB, and under the control of the third control node C, input the second clock signal CKB to the second output end Output_2.

The fourth output module 34 is connected to the fourth control node D and the second output end Output_2, and configured to receive the low level VGL, and under the control of the fourth control node D, input the low level VGL to the second output end Output_2.

To be specific, the first input module includes: a first input transistor, a gate electrode of which is configured to receive the first clock signal, a first electrode of which is configured to receive the start signal, and a second electrode of which is connected to the first control node; and a first capacitor, a first end of which is connected to the first electrode of the first input transistor, and a second end of which is configured to receive the first clock signal.

During the actual application, in the case that the first input module is included in a first-level shift register unit of a shift register, it is unnecessary to provide a capacitor to change a potential at the control node of a previous-level shift register unit through the clock signal at a specific stage, so the first input module may not include the first capacitor.

To be specific, the second input module includes a second input transistor, a gate electrode of which is configured to receive the first clock signal, a first electrode of which is configured to receive the first level, and a second electrode of which is connected to the second control node.

To be specific, the first output control module includes: a first control transistor, a gate electrode of which is connected to the second control node, and a first electrode of which is configured to receive the second level; and a second control transistor, a gate electrode of which is configured to receive the second clock signal, a first electrode of which is connected to a second electrode of the first control transistor, and a second electrode of which is connected to the first control node.

To be specific, the second output control module includes a third control transistor, a gate electrode of which is connected to the first control node, a first electrode of which is connected to the second control node, and a second electrode of which is configured to receive the first clock signal.

To be specific, the first output module includes a first output transistor, a gate electrode of which is connected to the first control node, a first electrode of which is connected to the first output end, and a second electrode of which is configured to receive the first clock signal.

To be specific, the second output module includes: a second output transistor, a gate electrode of which is connected to the second control node, a first electrode of which is configured to receive the first level, and a second electrode of which is connected to the first output end; and a second capacitor, a first end of which is configured to receive the first level, and a second end of which is connected to the second control node.

To be specific, the third input module includes: a third input transistor, a gate electrode of which is configured to receive the second clock signal, a first electrode of which is connected to the first control node, and a second electrode of which is connected to the third control node; and a third capacitor, a first end of which is configured to receive the second clock signal, and a second end of which is connected to the first control node.

To be specific, the fourth input module includes a fourth input transistor, a gate electrode of which is configured to receive the second clock signal, a first electrode of which is configured to receive the first level, and a second electrode of which is connected to the fourth control node.

To be specific, the third output control module includes: a fourth control transistor, a gate electrode of which is connected to the fourth control node, and a first electrode of which is configured to receive the second level; and a fifth control transistor, a gate electrode of which is configured to receive the second clock signal, a first electrode of which is connected to a second electrode of the fourth control transistor, and a second electrode of which is connected to the third control node.

To be specific, the fourth output control module includes a sixth control transistor, a gate electrode of which is connected to the third control node, a first electrode of which is connected to the fourth control node, and a second electrode of which is configured to receive the second clock signal.

To be specific, the third output module includes a third output transistor, a gate electrode of which is connected to the third control node, a first electrode of which is connected to the second output end, and a second electrode of which is configured to receive the second clock signal.

To be specific, the fourth output module includes: a fourth output transistor, a gate electrode of which is connected to the fourth control node, a first electrode of which is configured to receive the first level, and a second electrode of which is connected to the second output end; and a fourth capacitor, a first end of which is configured to receive the first level, and a second end of which is connected to the fourth control node.

All transistors adopted in the embodiments of the present disclosure may be thin film transistors (TFTs), or field effect transistors (FETs), or any other elements having the same characteristics. In the embodiments of the present disclosure, in order to differentiate the two electrodes, except the gate electrode, of each TFT from each other, the first electrode may be called as a source or drain electrode, and the second electrode may be called as a drain or source electrode. In addition, depending on its characteristics, the TFT may be an n-type transistor or a p-type transistor. For a driver circuit in the embodiments of the present disclosure, all the transistors are p-type transistors. Of course, the n-type transistors may also be used, which also fall within the scope of the present disclosure.

Figure 3:
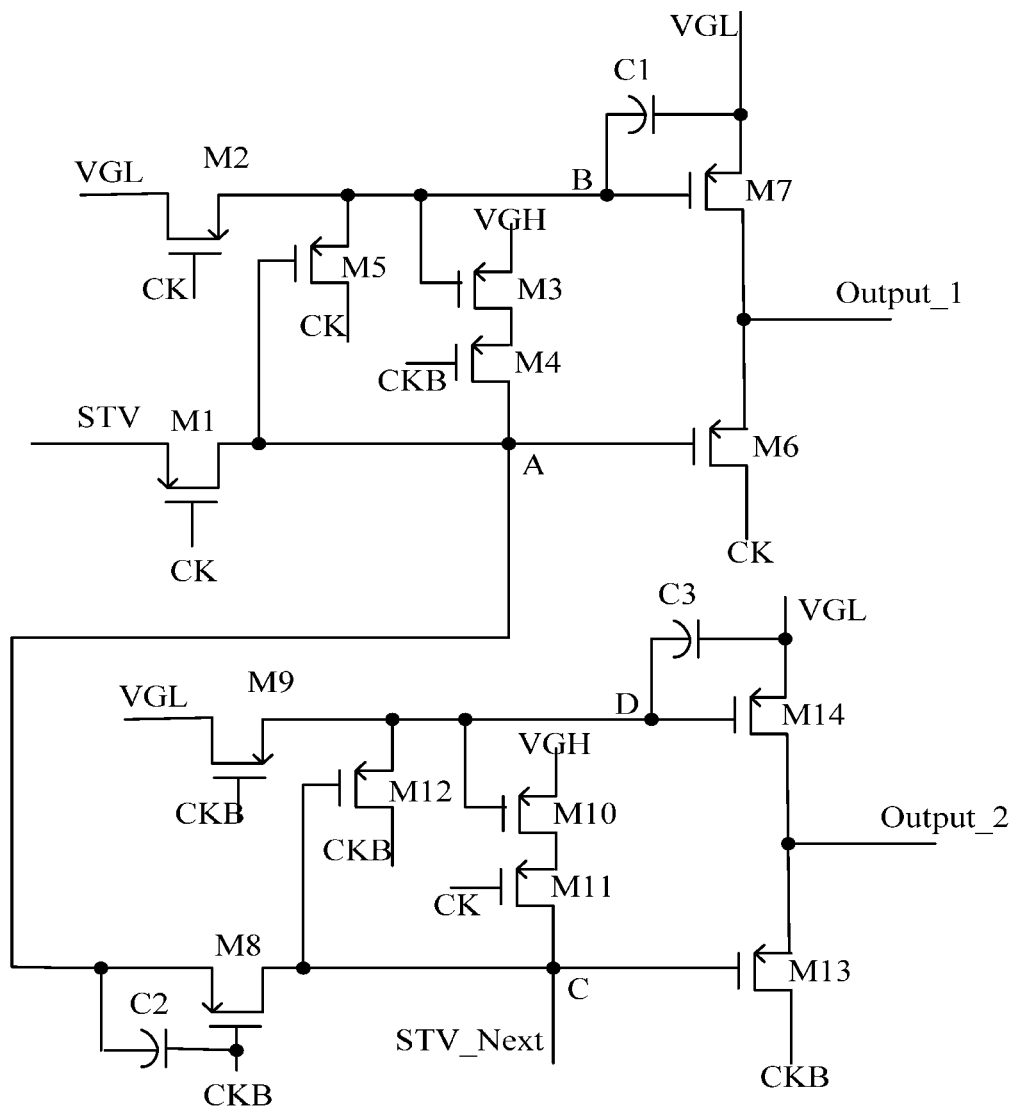
FIG. 3 is a circuit diagram of the shift register unit according to one embodiment of the present disclosure.

As shown in FIG. 3, the first input module includes: a first input transistor M1, a gate electrode of which is configured to receive the first clock signal CK, a source electrode of which is configured to receive the start signal STV, and a drain electrode of which is connected to the first control node A.

The second input module includes a second input transistor M2, a gate electrode of which is configured to receive the first clock signal CK, a source electrode of which is configured to receive the low level VGL, and a drain electrode of which is connected to the second control node B.

The first output control module includes: a first control transistor M3, a gate electrode of which is connected to the second control node B, and a source electrode of which is configured to receive the high level VGH; and a second control transistor M4, a gate electrode of which is configured to receive the second clock signal CKB, a source electrode of which is connected to a drain electrode of the first control transistor M3, and a drain electrode of which is connected to the first control node A.

The second output control module includes a third control transistor M5, a gate electrode of which is connected to the first control node A, a source electrode of which is connected to the second control node B, and a drain electrode of which is configured to receive the first clock signal CK.

To be specific, the first output module includes a first output transistor M6, a gate electrode of which is connected to the first control node A, a source electrode of which is connected to the first output end Output_1, and a drain electrode of which is configured to receive the first clock signal CK.

The second output module includes: a second output transistor M7, a gate electrode of which is connected to the second control node B, a source electrode of which is configured to receive the low level VGL, and a drain electrode of which is connected to the first output end Output_1; and a first storage capacitor C1, a first end of which is configured to receive the low level VGL, and a second end of which is connected to the second control node B.

The third input module includes: a third input transistor M8, a gate electrode of which is configured to receive the second clock signal CKB, a source electrode of which is connected to the first control node A, and a drain electrode of which is connected to the third control node C; and an input capacitor C2, a first end of which is configured to receive the second clock signal CKB, and a second end of which is connected to the first control node A.

The fourth input module includes a fourth input transistor M9, a gate electrode of which is configured to receive the second clock signal CKB, a source electrode of which is configured to receive the low level VGL, and a drain electrode of which is connected to the fourth control node D.

The third output control module includes: a fourth control transistor M10, a gate electrode of which is connected to the fourth control node D, and a source electrode of which is configured to receive the high level VGH; and a fifth control transistor M11, a gate electrode of which is configured to receive the second clock signal CKB, a source electrode of which is connected to a drain electrode of the fourth control transistor M10, and a drain electrode of which is connected to the third control node C.

The fourth output control module includes a sixth control transistor M12, a gate electrode of which is connected to the third control node C, a source electrode of which is connected to the fourth control node D, and a drain electrode of which is configured to receive the second clock signal CKB.

The third output module includes a third output transistor M13, a gate electrode of which is connected to the third control node C, a source electrode of which is connected to the second output end Output_2, and a drain electrode of which is configured to receive the second clock signal CKB.

The fourth output module includes: a fourth output transistor M14, a gate electrode of which is connected to the fourth control node D, a source electrode of which is configured to receive the low level VGL, and a drain electrode of which is connected to the second output end Output_2; and a second storage capacitor C3, a first end of which is configured to receive the low level VGL, and a second end of which is connected to the fourth control node D.

In FIG. 3, all the transistors are p-type TFTs.

As shown in FIG. 2, an operating procedure of the shift register unit in FIG. 3 will be described as follows.

At the stage a: a low level signal is applied to the start signal input end, CK is a low level signal, and CKB is a high level signal. At this time, under the control of the low level signal CK, M1, M2 and M5 are turned on. In the case that M1 is in an on state, the low level signal applied to the start signal input end is written into the first control node A and stored in C2. M6 is turned on under the control of the first control node A, so as to input the low level signal CK to Output_1. Meanwhile, in the case that M2 is in the on state under the control of the low level signal CK, VGL is inputted to the second control node B and charge C1. In addition, in the case that M6 is in the on state under the control of the first control node A, the low level signal CK is also transmitted to the second control node B. The low level signal CK and VGL has a same level, so the potential at the second control node B will not be affected. At this time, M7 is turned on under the control of the second control node B, so as to input VGL to Output_1, thereby to improve an output effect.

At this time, the potential at the first control node A is a low level, and this low level signal may be transmitted to the source electrode of M8. However, M8 is in an off state under the control of the high level signal CKB, so a state of the second shift register module will not be affected.

At the stage b: CKB is a low level signal, and CK is a high level signal. Due to C2, the first control node A in the first shift register module may be affected by the low level signal CKB from the second shift register module, so the potential at the first control node A may be pulled down to strength the output from M6 as well as the output from M8 in the second register module. Due to M6, the high level signal CK is inputted to the output end Output_1 of the first shift register module. In addition, M10 in the second shift register module is turned on, so as to write the low level signal at the first control node A to the third control node C. At this time, in the first shift register module, M5 is turned on under the control of the low level signal at the first control node A, and the high level signal CK is inputted to the second control node B, so as to charge C1 and turn off M7. In the second shift register module, M13 is turned on due to the low level at the third control node C, and the low level signal CKB is outputted to the output end Output_2 of the second shift register module. In addition, M12 is turned on under the control of the third control node C, so as to write the low level signal CKB to the fourth control node D. M9 is also turned on under the control of CKB, so as to input VGL to the fourth control node, thereby to strength the output from the fourth control node D. M14 is turned on under the control of the fourth control node D, so as to input VGL to the output end Output_2 of the second shift register module, thereby to strength the output from the output end Output_2.

At the stage c: STV is a high level signal, CKB is a high level signal, and CK is a low level signal. At this time, in the first shift register module, the transistors may be turned on under the control of CK. To be specific, M1 is turned on, so as to write the high level signal STV to the first control node A, thereby to turn off M6 and M5. M2 is turned on, so as to write VGL to the second control node B and turn on M7, thereby to write VGL to the output end Output_1 of the first shift register module.

At this time, the stage b is completed by the second shift register module. In other words, the potential at the third control node C is pulled down under the control of CK and a capacitor of a second-level shift register unit connected to the start signal input end, so as to transmit the high level signal CKB at the source electrode of M13, thereby to output VGH of the second shift register module.

At the stage d: STV is a high level signal, CK is a high level signal, and CKB is a low level signal. In the first shift register module, the second control node B is maintained at VGL like at stage c, so as to turn on M7 and M3. In the case that M7 is in the on state, VGL is continuously inputted to the output end Output_1 of the first shift register module. In the case that M3 is in the on state, VGH is inputted to the source electrode of M4. At this time, M4 is also turned on under the control of CKB, so as to input VGH to the first control node A through M4, thereby to maintain the potential at the first control node A, maintain M6 to be in the off state, and ensure the stable output from Output_1.

At this time, M8 of the second shift register module is turned on under the control of CKB, so as to write VGH at the first control node A to the third control node C, thereby to enable the first shift register module to complete the stage c.

The operating procedure of the first shift register module at the stage e is identical to that at the stage c, and a time sequence of the first shift register module at the stage f is identical to that at the stage d.

The present disclosure further provides in some embodiments a method for driving the above-mentioned shift register unit, which includes steps of: inputting, by the first input module, the start signal to the first control node under the control of the first clock signal; inputting, by the second input module, the first level to the second control node under the control of the first clock signal; inputting, by the first output control module, the second level to the first control node under the control of the second clock signal and the second control node; inputting, by the second output control module, the first clock signal to the second control node under the control of the first control node; inputting, by the first output module, the first clock signal to the first input end under the control of the first control node; inputting, by the second output module, the first level to the first output end under the control of the second control node; inputting, by the third input module, a signal from the first control node to the third control node under the control of the second clock signal; inputting, by the fourth input module, the first level to the fourth control node under the control of the second clock signal; inputting, by the third output control module, the second level to the third control node under the control of the first clock signal and the fourth control node; inputting, by the fourth output control module, the second clock signal to the fourth control node under the control of the third control node; inputting, by the third output module, the second clock signal to a second output end under the control of the third control node; and inputting, by the fourth output module, the first level to the second output end under the control of the fourth control node.

The present disclosure further provides in some embodiments a shift register including multiple levels of the above-mentioned shift register units. Apart from a first-level shift register unit, a start signal input end of a current-level shift register unit is connected to a third control node of a previous-level shift register unit.

The present disclosure further provides in some embodiments a display device including the above-mentioned shift register. The display device may include a liquid crystal display device, e.g., a liquid crystal panel, a liquid crystal television, a mobile phone, and a liquid crystal display. Apart from the liquid crystal display device, the display device may further include an organic light-emitting diode display or any other display devices, e.g., an e-book reader.

The above are merely the preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. A shift register unit, comprising a first shift register circuit and a second shift register circuit,
wherein the first shift register circuit comprises:
a start signal input end;
a first output end;
a first control node;
a second control node;
a first input circuit connected to the start signal input end and configured to input a start signal to the first control node under control of a first clock signal;
a second input circuit configured to input a first voltage level to the second control node under the control of the first clock signal;
a first output control circuit configured to input a second voltage level to the first control node under the control of a second clock signal and the second control node;
a second output control circuit configured to input the first clock signal to the second control node under the control of the first control node;
a first output circuit configured to input the first clock signal to the first output end under the control of the first control node; and
a second output circuit configured to input the first voltage level to the first output end under the control of the second control node,
wherein the second shift register circuit comprises:
a second output end;
a third control node;
a fourth control node;
a third input circuit connected to the first control node and configured to input a signal from the first control node to the third control node under the control of the second clock signal;
a fourth input circuit configured to input the first voltage level to the fourth control node under the control of the second clock signal;
a third output control circuit configured to input the second voltage level to the third control node under the control of the first clock signal and the fourth control node;
a fourth output control circuit configured to input the second clock signal to the fourth control node under the control of the third control node;
a third output circuit configured to input the second clock signal to the second output end under the control of the third control node; and
a fourth output circuit configured to input the first voltage level to the second output end under the control of the fourth control node,
wherein the first clock signal is of a phase reverse to the second clock signal.

2. The shift register unit according to claim 1, wherein
the first input circuit is connected to the first control node, and configured to receive the first clock signal and the start signal, and under the control of the first clock signal, input the start signal to the first control node at a first initial stage and a first maintenance stage, and maintain a potential at the first control node to be invalid at the first maintenance stage;
the second input circuit is connected to the second control node, configured to receive the first clock signal and the first voltage level, and configured to input the first voltage level to the second control node at the first initial stage and the first maintenance stage;
the first output control circuit is connected to the first control node and the second control node, and configured to receive the second voltage level and the second clock signal, and input the second voltage level to the first control node at the first maintenance stage under the control of the second clock signal and the second control node;
the second output control circuit is connected to the first control node and the second control node, and configured to receive the first clock signal, and input the first clock signal to the second control node at a first output stage under the control of the first control node;
the first output circuit is connected to the first control node and the first output end, and configured to receive the first clock signal, and input the first clock signal to the first output end under the control of the first control node; and
the second output circuit is connected to the second control node and the first output end, and configured to receive the first voltage level, and input the first voltage level to the first output end under the control of the second control node.

3. The shift register unit according to claim 2, wherein
the third input circuit is connected to the first control node and the third control node, and configured to receive the second clock signal, pull down the potential at the first control node under the control of the second clock signal at the first output stage, and under the control of the second clock signal, input the signal from the first control node to the third control node at a second initial stage, and maintain a potential at the third control node to be invalid at a second maintenance stage;
the fourth input circuit is connected to the fourth control node, and configured to receive the second clock signal and the first voltage level, and input the first voltage level to the fourth control node at the second initial stage and the second maintenance stage;
the third output control circuit is connected to the third control node and the fourth control node, and configured to receive the second voltage level and the first clock signal, and under the control of the first clock signal and the fourth control node, input the second voltage level to the third control node at the second maintenance stage;
the fourth output control circuit is connected to the third control node and the fourth control node, and configured to receive the second clock signal, and input the second clock signal to the fourth control node at a second output stage under the control of the third control node;

the third output circuit is connected to the third control node and the second output end, and configured to receive the second clock signal, and under the control of the third control node, input the second clock signal to the second output end;

the fourth output circuit is connected to the fourth control node and the second output end, and configured to receive the first voltage level, and under the control of the fourth control node, and output the first voltage level at the second output end; and the first output stage is the second initial stage, the second output stage is half a clock cycle later than the first output stage, and the second maintenance stage is half a clock cycle later than the first maintenance stage.

4. The shift register unit according to claim 3, wherein the first input circuit comprises:
a first input transistor, a gate electrode of which is configured to receive the first clock signal, a first electrode of which is configured to receive the start signal, and a second electrode of which is connected to the first control node; and
a first capacitor, a first end of which is connected to the first electrode of the first input transistor, and a second end of which is configured to receive the first clock signal.

5. The shift register unit according to claim 3, wherein the second input circuit comprises a second input transistor, a gate electrode of which is configured to receive the first clock signal, a first electrode of which is configured to receive the first voltage level, and a second electrode of which is connected to the second control node.

6. The shift register unit according to claim 3, wherein the first output control circuit comprises:
a first control transistor, a gate electrode of which is connected to the second control node, and a first electrode of which is configured to receive the second voltage level; and
a second control transistor, a gate electrode of which is configured to receive the second clock signal, a first electrode of which is connected to a second electrode of the first control transistor, and a second electrode of which is connected to the first control node.

7. The shift register unit according to claim 3, wherein the second output control circuit comprises a third control transistor, a gate electrode of which is connected to the first control node, a first electrode of which is connected to the second control node, and a second electrode of which is configured to receive the first clock signal.

8. The shift register unit according to claim 3, wherein the first output circuit comprises a first output transistor, a gate electrode of which is connected to the first control node, a first electrode of which is connected to the first output end, and a second electrode of which is configured to receive the first clock signal.

9. The shift register unit according to claim 3, wherein the second output circuit comprises:
a second output transistor, a gate electrode of which is connected to the second control node, a first electrode of which is configured to receive the first voltage level, and a second electrode of which is connected to the first output end; and
a second capacitor, a first end of which is configured to receive the first voltage level, and a second end of which is connected to the second control node.

10. The shift register unit according to claim 3, wherein the third input circuit comprises:
a third input transistor, a gate electrode of which is configured to receive the second clock signal, a first electrode of which is connected to the first control node, and a second electrode of which is connected to the third control node; and
a third capacitor, a first end of which is configured to receive the second clock signal, and a second end of which is connected to the first control node.

11. The shift register unit according to claim 3, wherein the fourth input circuit comprises a fourth input transistor, a gate electrode of which is configured to receive the second clock signal, a first electrode of which is configured to receive the first voltage level, and a second electrode of which is connected to the fourth control node.

12. The shift register unit according to claim 3, wherein the third output control circuit comprises:
a fourth control transistor, a gate electrode of which is connected to the fourth control node, and a first electrode of which is configured to receive the second voltage level; and
a fifth control transistor, a gate electrode of which is configured to receive the second clock signal, a first electrode of which is connected to a second electrode of the fourth control transistor, and a second electrode of which is connected to the third control node.

13. The shift register unit according to claim 3, wherein the fourth output control circuit comprises a sixth control transistor, a gate electrode of which is connected to the third control node, a first electrode of which is connected to the fourth control node, and a second electrode of which is configured to receive the second clock signal.

14. The shift register unit according to claim 3, wherein the third output circuit comprises a third output transistor, a gate electrode of which is connected to the third control node, a first electrode of which is connected to the second output end, and a second electrode of which is configured to receive the second clock signal.

15. The shift register unit according to claim 3, wherein the fourth output circuit comprises:
a fourth output transistor, a gate electrode of which is connected to the fourth control node, a first electrode of which is configured to receive the first voltage level, and a second electrode of which is connected to the second output end; and
a fourth capacitor, a first end of which is configured to receive the first voltage level, and a second end of which is connected to the fourth control node.

16. A display device comprising the shift register unit according to claim 1.

17. A method for driving a shift register unit, the shift register unit comprising a first shift register circuit and a second shift register circuit,
wherein the first shift register circuit comprises:
a start signal input end;
a first output end;
a first control node;
a second control node;
a first input circuit connected to the start signal input end and configured to input a start signal to the first control node under control of a first clock signal;

a second input circuit configured to input a first voltage level to the second control node under the control of the first clock signal;
a first output control circuit configured to input a second voltage level to the first control node under the control of a second clock signal and the second control node;
a second output control circuit configured to input the first clock signal to the second control node under the control of the first control node;
a first output circuit configured to input the first clock signal to the first output end under the control of the first control node; and
a second output circuit configured to input the first voltage level to the first output end under the control of the second control node,
wherein the second shift register circuit comprises:
a second output end;
a third control node;
a fourth control node;
a third input circuit connected to the first control node and configured to input a signal from the first control node to the third control node under the control of the second clock signal;
a fourth input circuit configured to input the first voltage level to the fourth control node under the control of the second clock signal;
a third output control circuit configured to input the second voltage level to the third control node under the control of the first clock signal and the fourth control node;
a fourth output control circuit configured to input the second clock signal to the fourth control node under the control of the third control node;
a third output circuit configured to input the second clock signal to the second output end under the control of the third control node; and
a fourth output circuit configured to input the first voltage level to the second output end under the control of the fourth control node,
wherein the first clock signal is of a phase reverse to the second clock signal;
the method comprising steps of:
inputting, by the first input circuit, the start signal to the first control node under the control of the first clock signal;
inputting, by the second input circuit, the first voltage level to the second control node under the control of the first clock signal;
inputting, by the first output control circuit, the second voltage level to the first control node under the control of the second clock signal and the second control node;
inputting, by the second output control circuit, the first clock signal to the second control node under the control of the first control node;
inputting, by the first output circuit, the first clock signal to a first input end under the control of the first control node;
inputting, by the second output circuit, the first voltage level to the first output end under the control of the second control node;
inputting, by the third input circuit, the signal from the first control node to the third control node under the control of the second clock signal;
inputting, by the fourth input circuit, the first voltage level to the fourth control node under the control of the second clock signal;
inputting, by the third output control circuit, the second voltage level to the third control node under the control of the first clock signal and the fourth control node;
inputting, by the fourth output control circuit, the second clock signal to the fourth control node under the control of the third control node;
inputting, by the third output circuit, the second clock signal to the second output end under the control of the third control node; and
inputting, by the fourth output circuit, the first voltage level to the second output end under the control of the fourth control node.

* * * * *